United States Patent
Otremba et al.

(10) Patent No.: US 9,972,576 B2
(45) Date of Patent: May 15, 2018

(54) SEMICONDUCTOR CHIP PACKAGE COMPRISING SIDE WALL MARKING

(71) Applicant: Infineon Technologies Austria AG, Villach (AT)

(72) Inventors: Ralf Otremba, Kaufbeuren (DE); Teck Sim Lee, Melaka (MY); Amirul Afiq Hud, Melaka (MY); Fabian Schnoy, Tegernheim (DE); Felix Grawert, Villach (AT); Uwe Kirchner, Feldkirchen (AT); Bernd Schmoelzer, Radenthein (AT); Franz Stueckler, St. Stefan (AT)

(73) Assignee: Infineon Technologies Austria AG, Villach (AT)

( * ) Notice: Subject to any disclaimer, the term of this patent is extended or adjusted under 35 U.S.C. 154(b) by 0 days. days.

(21) Appl. No.: 15/361,034

(22) Filed: Nov. 24, 2016

(65) Prior Publication Data
US 2017/0148743 A1 May 25, 2017

(30) Foreign Application Priority Data
Nov. 25, 2015 (DE) .................. 10 2015 120 396

(51) Int. Cl.
| | |
|---|---|
| *H01L 23/28* | (2006.01) |
| *H01L 23/544* | (2006.01) |
| *H01L 23/31* | (2006.01) |
| *H01L 23/495* | (2006.01) |
| *H01L 23/535* | (2006.01) |

(52) U.S. Cl.
CPC ........ *H01L 23/544* (2013.01); *H01L 23/3114* (2013.01); *H01L 23/4952* (2013.01); *H01L 23/49562* (2013.01); *H01L 23/535* (2013.01); *H01L 2223/5442* (2013.01); *H01L 2223/54433* (2013.01); *H01L 2223/54486* (2013.01); *H01L 2224/32245* (2013.01); *H01L 2224/48091* (2013.01); *H01L 2224/48247* (2013.01); *H01L 2224/48471* (2013.01); *H01L 2224/73265* (2013.01); *H01L 2924/181* (2013.01)

(58) Field of Classification Search
CPC ......... H01L 2223/54406; H01L 21/565; H01L 21/56; H01L 2924/181
USPC .......................... 257/787, 797, 798
See application file for complete search history.

(56) References Cited

U.S. PATENT DOCUMENTS

| | | | |
|---|---|---|---|
| 4,707,726 A | 11/1987 | Tinder | |
| 6,052,062 A * | 4/2000 | Tuttle | ............................ 257/787 |
| 6,306,680 B1 | 10/2001 | Fillion et al. | |
| 6,420,790 B1 * | 7/2002 | Koizumi | ............. H01L 23/3121 257/787 |

(Continued)

FOREIGN PATENT DOCUMENTS

| | | |
|---|---|---|
| DE | 102005057401 B4 | 10/2009 |
| DE | 102015101674 A1 | 8/2016 |

*Primary Examiner* — S. V. Clark

(57) ABSTRACT

The semiconductor chip package comprises a semiconductor chip, and an encapsulation body encapsulating the semiconductor chip, wherein the encapsulation body comprises a semiconductor chip; an encapsulation body encapsulating the semiconductor chip, wherein the encapsulation body comprises two opposing main faces and side faces which connect the two main faces with each other, wherein the side face have a smaller surface area than the main faces, respectively, and wherein a marking is provided on at least one of the side faces.

16 Claims, 3 Drawing Sheets

(56) References Cited

U.S. PATENT DOCUMENTS

| | | | |
|---|---|---|---|
| 6,621,153 B2* | 9/2003 | Kawai | G06K 19/041 |
| | | | 257/679 |
| 7,154,168 B2* | 12/2006 | Joshi | H01L 23/3121 |
| | | | 257/502 |
| 7,619,302 B2 | 11/2009 | Hauenstein | |
| 7,799,614 B2 | 9/2010 | Otremba et al. | |
| 8,836,110 B2 | 9/2014 | Chopin et al. | |
| 2004/0000744 A1* | 1/2004 | Grigg | B29C 67/0066 |
| | | | 264/401 |
| 2004/0061206 A1 | 4/2004 | Son | |
| 2007/0200225 A1 | 8/2007 | Ibrahim | |
| 2011/0304032 A1 | 12/2011 | Ramos | |
| 2014/0091446 A1 | 4/2014 | Xue | |

* cited by examiner

A)

B)

C)

SEMICONDUCTOR CHIP PACKAGE COMPRISING SIDE WALL MARKING

TECHNICAL FIELD

The present disclosure relates to the field of semiconductor chip packages.

BACKGROUND

A semiconductor chip package may comprise a semiconductor chip, an encapsulation body encapsulating the semiconductor chip, and electrical contact elements connected with the semiconductor chip and extending through the encapsulation body to form external contact elements. The external contact elements can be formed in different ways for serving different desires or requirements on the customer's side. According to one variant the semiconductor chip package is formed as a through-hole device in which the external contact elements are formed as contact pins to be inserted in through-hole sockets on the customer's side. According to another variant the semiconductor chip package is formed as a surface mount device in which the external contact elements are formed with flat coplanar lower surfaces to be attached on a suitable contact surface on the customer's side.

For the fabrication of semiconductor chip packages and their electrical contact elements other aspects have to be taken also into consideration. One aspect may be that the semiconductor chip may produce heat during operation and the complete design of the semiconductor chip package may have to be optimized to facilitate most efficient heat dissipation. Another aspect concerns the labelling of the semiconductor chip package, in particular the problem of how and where to provide a marking in order to facilitate the recognition of the type or kind of a semiconductor chip package or the semiconductor chip by the customer or other persons.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description.

The elements of the drawings are not necessarily to scale relative to each other. Like reference numerals designate corresponding similar parts.

DETAILED DESCRIPTION

Figure 1:
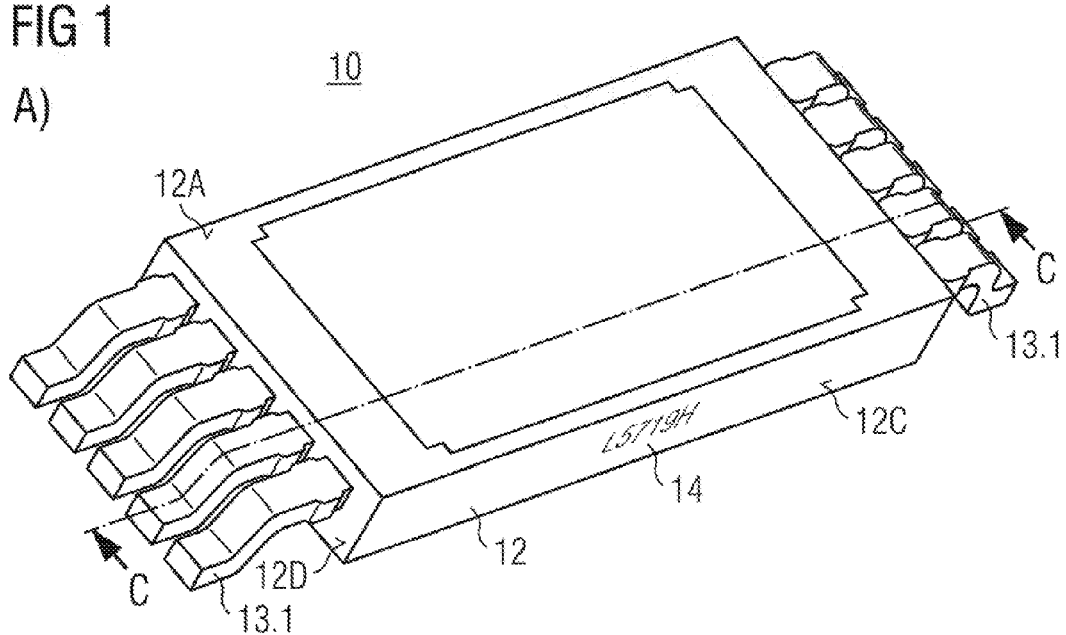
FIG. 1 comprises FIG. 1A-1C and shows a schematic perspective top view representation (A), a schematic side view representation (B), and a schematic cross-sectional side view representation (C) of a semiconductor chip package designed for surface mounting technology according to an example.
Figure 1:
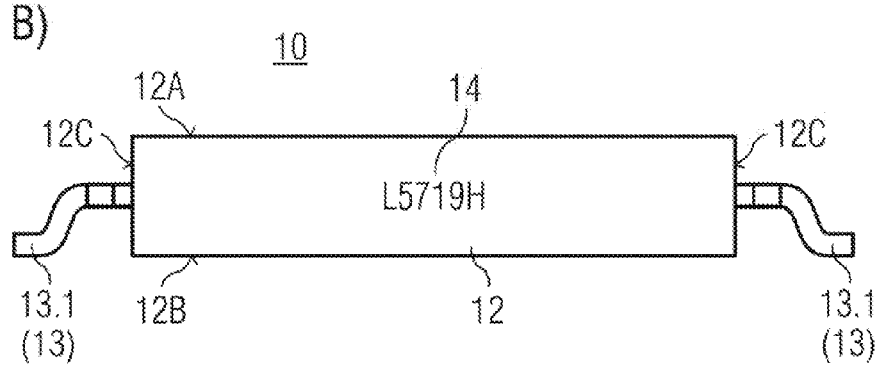
Figure 1:
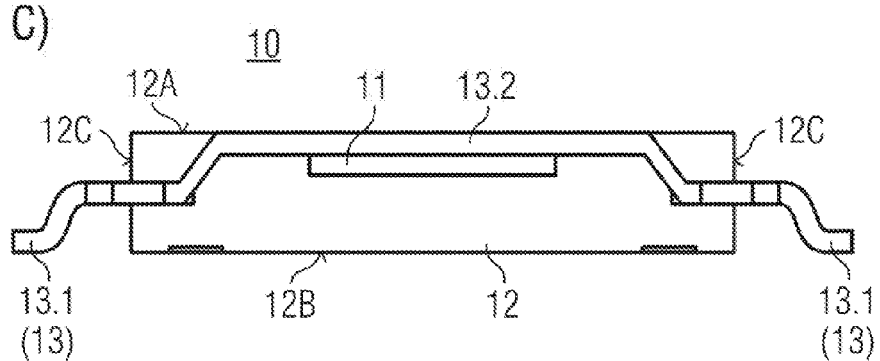

In the following detailed description reference is made to the accompanying drawings, which form a part hereof, and in which is shown by way of illustration specific examples in which the disclosure may be practiced. In this regard, directional terminology, such as "top", "bottom", "front", "back", "leading", "trailing", etc., is used with reference to the orientation of the Figure(s) being described. Because components of examples can be positioned in a number of different orientations, the directional terminology is used for purposes of illustration and is in no way limiting. It is to be understood that other examples may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various examples described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

Devices or semiconductor chip packages containing semiconductor chips are described below. The semiconductor chips may be of different types, may be manufactured by different technologies and may include for example integrated electrical, electro-optical or electro-mechanical circuits and/or passives. The semiconductor chips may, for example, be designed as logic integrated circuits, analog integrated circuits, mixed signal integrated circuits, power integrated circuits, memory circuits or integrated passives. They may include control circuits, microprocessors or micro-electromechanical components. Further, they may be configured as power semiconductor chips, such as power MOSFETs (Metal-oxide Semiconductor Field Effect Transistors), IGBTs (Insulated Gate Bipolar Transistors), JFETs (Junction Gate Field Effect Transistors), power bipolar transistors or power diodes. In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure may have contact elements in particular on its two main faces, that is to say on its top side and bottom side. In particular, power semiconductor chips may have a vertical structure. By way of example, the source electrode and gate electrode of a power MOSFET may be situated on one main face, while the drain electrode of the power MOSFET is arranged on the other main face. Furthermore, the electronic devices described below may include integrated circuits to control the integrated circuits of other semiconductor chips, for example the integrated circuits of power semiconductor chips. The semiconductor chips can be manufactured on the basis of a specific semiconductor material, for example Si, SiC, SiGe, GaAs, GaN, AlGaAs, but can also be manufactured on the basis of any other semiconductor material and, furthermore, may contain inorganic and/or organic materials that are not semiconductors, such as for example insulators, plastics or metals.

The examples of a semiconductor chip package may comprise an encapsulant or encapsulating material for embedding the semiconductor chip or other insulating or dielectric materials. These encapsulating, insulator or dielectric materials can be any electrically insulating material like, for example, any kind of molding material, any kind of resin material, or any kind of epoxy material. The mentioned materials can also comprise one or more of a polymer material, a polyimide material, a thermoplast material, a silicone material, a ceramic material, and a glass material. The mentioned materials may also comprise any of the above-mentioned materials and further include filler materials embedded therein like, for example, thermally conductive increments. These filler increments can be made of AlO or $Al_2O_3$, AlN, BN, or SiN, for example. Furthermore the filler increments may have the shape of fibers and can be made of carbon fibers or nanotubes, for example. After its deposition the encapsulant, for example, may be only partially hardened and may be completely hardened after application of energy (e.g. heat, UV light, etc.) to form an encapsulant. Various techniques may be employed to cover the semiconductor chips with the encapsulant, for example one or more of compression molding, transfer molding, injection molding, power molding, liquid molding, dispensing or laminating.

FIG. 1 comprises FIG. 1A-1C and shows an example of a semiconductor chip package according to an example in a schematic perspective top view representation (A), a schematic side view representation (B), and a schematic cross-sectional side view representation (C), wherein the latter was taken in a plane as indicated by line C-C in FIG. 1A. The semiconductor chip package 10 comprises a semiconductor chip 11 and an encapsulation body 12 encapsulating the semiconductor chip 11. The encapsulation body 12 comprises two opposing main faces 12A and 12B and side faces 12C which connect the two main faces 12A and 12B with each other. The side faces 12C have a smaller surface area than the main faces 12A and 12B, respectively, and a marking 14 is provided on at least one of the side faces 12C.

According to an example of the semiconductor chip package 10 of FIG. 1, the marking 14 comprises an information about the semiconductor chip 11. According to a further example thereof, the information about the semiconductor chip 11 comprises a label or a code, wherein the label or the code characterizes the type or kind of the semiconductor chip 11.

According to an example of the semiconductor chip package 10 of FIG. 1, the information about the semiconductor chip 11 comprises one or more of the following group of information elements: type or kind of the semiconductor chip, current class, voltage class, power class, polarity, blocking capability, fabrication date (daycode).

According to an example of the semiconductor chip package 10 of FIG. 1, the marking 14 comprises an information about the semiconductor chip package 10 or the encapsulation body 12. According to a further example thereof, the information comprises a label or a code, wherein the label or the code characterizes the type or the kind of the semiconductor chip package 10 or the encapsulation body 12. According to an example of the semiconductor chip package 10 of FIG. 1, the marking 14 comprises at least one alphanumeric character or a combination of alphanumeric characters such as the marking "L5719H" as shown in FIG. 1. The marking "L5719H" is meant here only symbolically and has no technical meaning.

According to an example of the semiconductor chip package 10 of FIG. 1, the marking 14 comprises a portion comprising the company logo or company mark of the manufacturer of the semiconductor chip package 10.

According to an example of the semiconductor chip package 10 of FIG. 1, the marking 14 is generated by one or more of the following: printing, lasering, branding, and applying a liquid, in particular ink, onto the side face 12C.

According to an example of the semiconductor chip package 10 of FIG. 1, the marking 14 is provided on two opposing side faces 12C.

According to an example of the semiconductor chip package 1 of FIG. 1, the semiconductor chip package 10 comprises the shape of a cuboid. According to a further example thereof, the semiconductor chip package 10 comprises four side faces 12C, 12D, wherein the four side faces comprise a first pair of first opposing side faces 12C of a first surface area, and a second pair of second opposing side faces 12D of a second surface area, wherein the first surface area is greater than the second surface area. According to a further example thereof, the marking 14 is provided on one or both of the first opposing side faces 12C.

According to an example of the semiconductor chip package 10 of FIG. 1, the semiconductor chip package 10 further comprises electrical contact elements 13.1 connected with the semiconductor chip 11 and extending outwardly, wherein the electrical contact elements 13.1 extend through two opposing side faces 12D and the marking is provided on one of the other two opposing side faces 12C. According to a further example thereof, the electrical contact elements 13.1 extend exclusively through two opposing side faces 12D which have smaller surface areas than the other two opposing side faces 12C.

According to an example of the semiconductor chip package of FIG. 1, the semiconductor chip package 10 further comprises a chip pad 13.2, wherein the semiconductor chip 11 is disposed on the chip pad 13.2 and a first main face of the chip pad 13.2 remote from the semiconductor chip 11 is at least partially exposed to the outside. According to a further example thereof, the first main face of the chip pad 13.2 is exposed to the outside at one of the two opposing main faces 12A and 12B of the encapsulation body 12. In the example as shown in FIG. 1C, the first main face of the chip pad 13.2 is exposed at the main face 12A of the encapsulation body 12. The exposed first main face of the chip pad 13.2 is intended to serve a substrate or carrier of a heat sink to be applied thereupon, in particular on the customer's side.

According to an example of the semiconductor chip package 10 of FIG. 1, the semiconductor chip package 10 further comprises a leadframe 13 comprising the electrical contact elements 13.1 and the chip pad 13.2. According to a further example thereof, the electrical contact elements 13.1 comprise first electrical contact elements arranged at a first side of the two opposing side faces 12D and electrically connected with the chip pad 13.2, and second electrical contact elements arranged at a second side of the two opposing side faces 12D and electrically isolated from the chip pad 13.2.

According to an example of the semiconductor chip package 10 of FIG. 1, the marking 14 is provided also (or solely) on one or both of the opposing main faces 12A and 12B of the encapsulation body 12.

According to an example of the semiconductor chip package 10 of FIG. 1, the semiconductor chip 11 comprises one or more of a transistor, a metal-oxide semiconductor transistor, a vertical transistor, an insulated gate bipolar transistor (IGBT), and a power transistor. According to a further example thereof, the semiconductor chip 11 comprises a first main face, a second main face opposite to the first main face, a first contact pad disposed on the first main face, and a second contact pad disposed on the second main face, wherein the semiconductor chip 11 is disposed with the second main face on a chip pad 13.2. According to a further example thereof, the first contact pad is connected by a wire bond to at least one of the electrical contact elements 13.1.

According to an example of the semiconductor chip package 10 of FIG. 1, one or both of the semiconductor chip package 10 and the encapsulation body 12 comprise a shape of a cuboid. According to a further example thereof, a ratio between a length of a long side of the cuboid and a length of a short side of the cuboid is between 2 and 3 or greater than 3. According to an example, a length of the long side of the cuboid is in a range from 10 mm-25 mm, and a length of the short side of the cuboid is in a range from 4 mm-10 mm.

According to an example of the semiconductor chip package 10 of FIG. 1, the electrical contact elements 13.1 extend outwardly in a lateral or horizontal direction and are then bent in such a way that their lower surfaces are coplanar with each other and, in particular, also coplanar with a lower main face 12B of the encapsulation body 12. Such an example is depicted in FIG. 1.

According to an example of the semiconductor chip package 10 of FIG. 1, the semiconductor chip package 10 is configured as a surface-mount device such as the example shown in FIG. 1. According to a further example thereof, the semiconductor chip package 10 is one of the type TO 252 or TO 263.

According to a further example of a semiconductor chip package, the semiconductor chip package is configured as a through-hole device as will be shown in a further example below. According to an example thereof, the semiconductor chip package is one of the type TO 220 or TO 247.

According to an example of the semiconductor chip package 10 of FIG. 1, a main face 12A of the semiconductor chip package 10 comprises a central portion being formed by the exposed main face of a chip pad 13.2 and an edge portion being formed by a portion of the encapsulation body 12. According to a further example, the central portion can have a rectangular shape. According to a further example, the central portion may cover more than 50%, in particular more than 60%, in particular more than 70%, in particular more than 80%, in particular more than 90%, of the total surface area of the main face 12A of the encapsulation body 12. According to an example, the edge portion is configured so as to surround the central portion and is further configured such that opposing parts of the edge portion have equal widths.

On the customer's side a semiconductor chip package 10, such as that shown in FIG. 1, can be utilized by attaching a heat sink onto the main face 12A of the encapsulation body 12, the heat sink thereby being directly attached to the exposed main face of the chip pad 13.2. In this way a very efficient heat dissipation path can be formed from the semiconductor chip 11 to the outside which is particularly useful in the case of power devices like power transistors, in particular IGBT (insulated gate bipolar) transistors.

In case of a heat sink being attached to the main face 12A of the encapsulation body 12, any marking being provided on the edge portion of the main face 12A would probably be invisible for the customer as it would be covered by the heat sink. However, in this case the customer can still recognize the marking 14 on the side face 12C and can thus recognize and identify either one or both of the semiconductor chip package 10 or the semiconductor chip 11.

Figure 2:
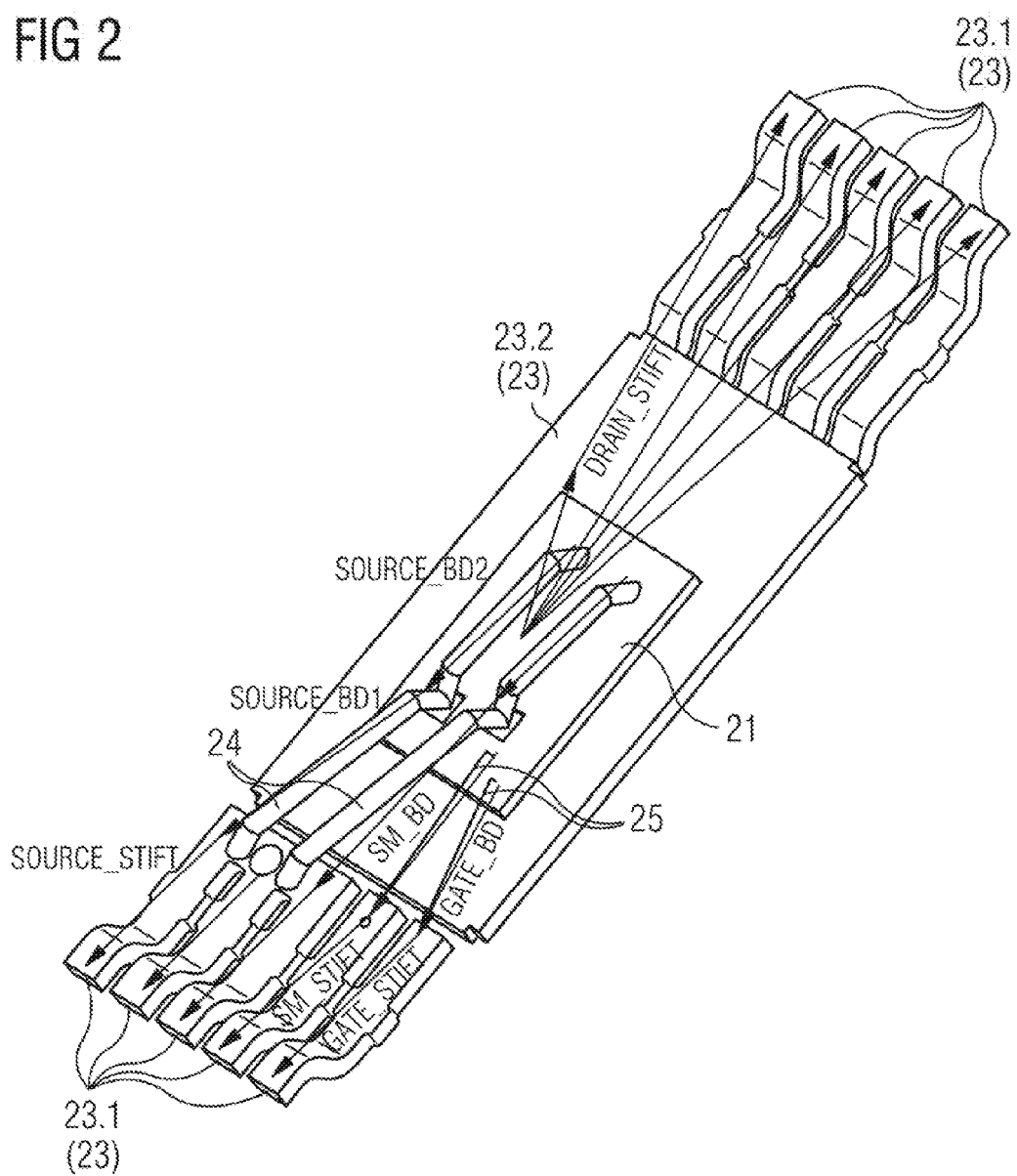
FIG. 2 shows a schematic perspective down view representation of an exemplary assembly which is yet to be encapsulated to form a semiconductor chip package such as that of FIG. 1.

FIG. 2 shows an assembly comprising a leadframe 23 and a semiconductor chip 21 connected to the leadframe 23. The assembly, as shown in FIG. 2, shows how the semiconductor chip package 10 of FIG. 1 may have looked like in a perspective down view representation before applying the encapsulation body 12 to it. The leadframe 23 comprises electrical contact elements 23.1 and a chip pad 23.2. The semiconductor chip 21 may be comprised of an insulated gate bipolar (IGB) transistor being attached with its drain pad surface to the chip pad 23.2. The electrical contact elements 23.1 comprise upper right electrical contact elements 23.1 and lower left electrical contact elements 23.1. The upper right electrical contact elements 23.1 are contiguous with the chip pad 23.2 and are thus on the same electrical potential as the drain contact of the semiconductor chip 21. The upper surface of the semiconductor chip 21 comprises a large source pad area and small gate pad and source sense areas. The large source pad area is connected to three once of the lower left electrical contact elements 23.1 by means of two wire bonds 24 which are both connected to two different contact areas of the large source contact pad. The other two lower left electrical contact elements 23.1 are connected with wire bonds 25 to the gate and source sense pads.

Figure 3:
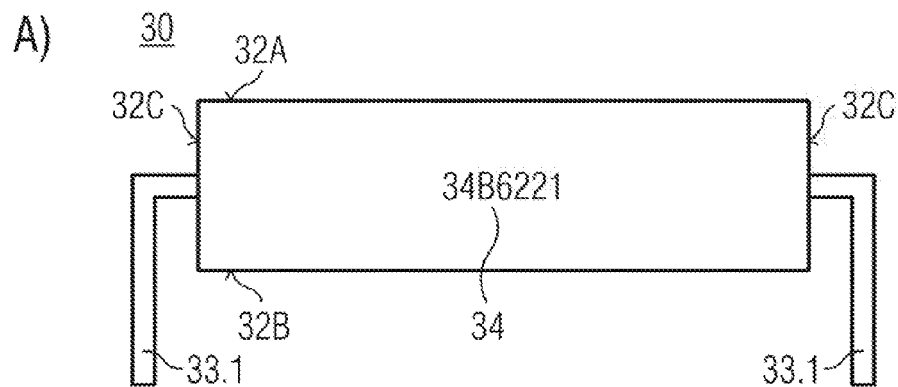
FIG. 3 comprises FIG. 3A-3C and shows a schematic side view representation (A), a schematic cross-sectional side view representation (B), and a top view representation (C) of a semiconductor chip package designed for through-hole mounting technology according to an example.
Figure 3:
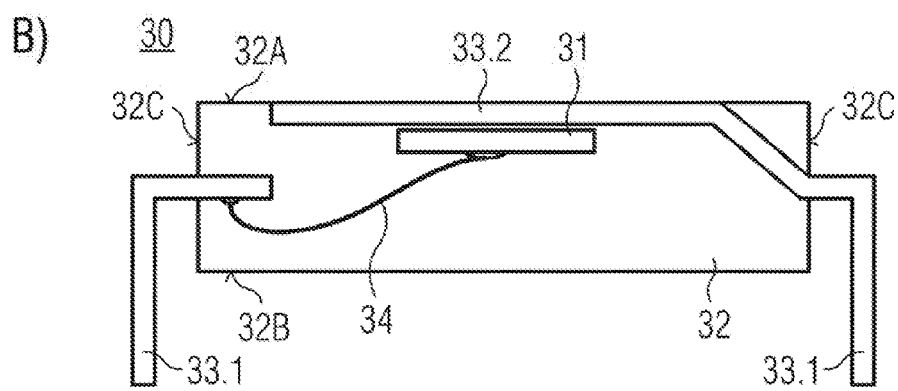
Figure 3:
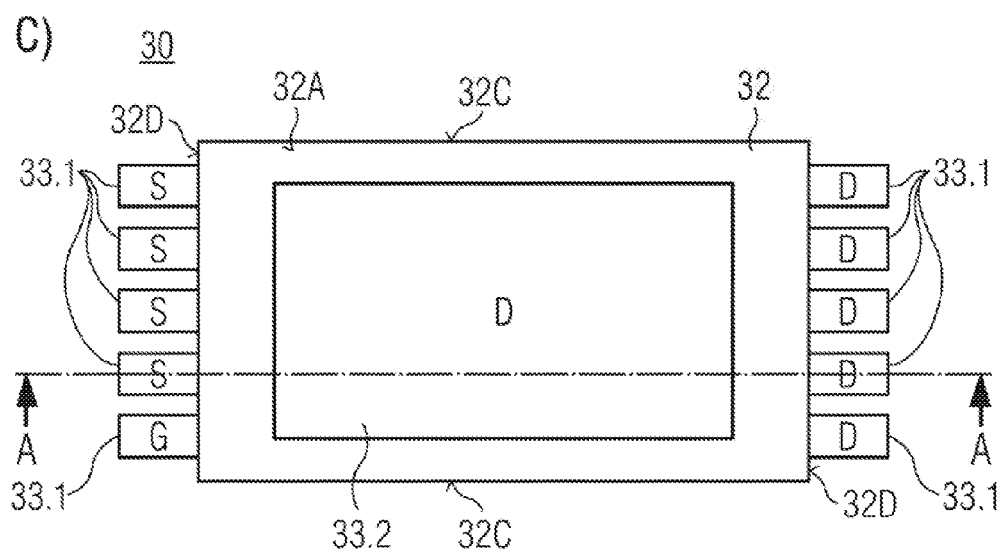

FIG. 3 comprises FIG. 3A to 3C and shows an example of a semiconductor chip package according to an example in a schematic side view representation (A), a schematic cross-sectional side view representation (B), and in a top view representation (C), wherein the cross-sectional side view representation of FIG. 3B was taken along a plane indicated by line A-A in FIG. 3C. The semiconductor chip package 30 of FIG. 3 comprises a semiconductor chip 31 and an encapsulation body 32 encapsulating the semiconductor chip 31. The encapsulation body 32 comprises two opposing main faces 32A and 32B and side faces 32C which connect the two main faces 32A and 32B with each other. The side faces 32C have a smaller surface area than the main faces 32A and 32B, respectively. A marking 34 is provided on at least one of the side faces 32C. The marking "34B6221" is meant only symbolically and has no technical meaning.

The semiconductor chip package 30 of FIG. 3 may comprise a chip pad 33.2 having the semiconductor chip 31 disposed thereon, and electrical contact elements 33.1 connected with the semiconductor chip 31 and extending through the encapsulation body 32 in an outward direction. The electrical contact elements 33.1 may be configured as contact pins as shown in FIG. 3A and 3B so that the semiconductor chip package 30 is construed as a through-hole device.

Besides the differently formed electrical contact elements 33.1, as compared with the semiconductor chip package 10 of FIG. 1, all features, which were described in connection with the semiconductor chip package 10, can also be applied to the semiconductor chip package 30 of FIG. 3 so that they will not be repeated again.

In particular, the electrical contact elements 33.1 may comprise first electrical contact elements arranged at the side face 32D and may be contiguous with the chip pad 33.2, and second electrical contact elements 33.1 may be arranged at the side face 12C not being contiguous with the chip 33.2. More specifically, it can be the case that the semiconductor chip 31 is comprised of an insulated gate bipolar transistor (IGBT) having a drain contact pad at an upper surface thereof and a gate contact pad arranged on a lower surface, a source contact pad arranged on the lower surface, and a source sense contact pad arranged on the lower surface. In this case the first electrical contact elements 33.1, arranged at the side face 32D, are all electrically connected with the chip pad 33.2 and thus with the drain contact element and are therefore designated with "D" in FIG. 3C. The second electrical contact elements 33.1 are designated with "S" and "G" in FIG. 3C which means that they are connected by wire bonds 34 to either one of the gate, source or source-sense contact pads on the lower surface of the semiconductor chip 31.

The present disclosure also relates to a method for fabricating a semiconductor chip package, the method comprising providing a semiconductor chip,
fabricating an encapsulation body by encapsulating the semiconductor chip in such a way that the encapsulation body comprises two opposing main faces and side faces which connect the two main faces with each other, wherein the side face have a smaller surface area than the main faces, respectively, and
providing a marking on at least one of the side faces.

According to an example of the method, the marking is generated by one or more of the following: printing, lasering, branding, and applying a liquid, in particular ink, onto the side face. When lasering or branding is performed, the mechanism can be such that an upper layer of the encapsulation body is ablated or altered, both in such a way that a contrast is generated by which the marking becomes recognizable and visible.

According to further examples of the method, examples described above with respect to the semiconductor chip packages are transformed into examples of the method, which means that appropriate method steps will be carried out in order to fabricate a semiconductor chip package according to one or more of the above described examples of a semiconductor chip package.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor chip package, comprising:
   a semiconductor chip;
   an encapsulation body encapsulating the semiconductor chip;
   a chip pad;
   wherein the encapsulation body comprises two opposing main faces and side faces which connect the two main faces with each other, wherein the side faces have a smaller surface area than the main faces, respectively;
   wherein a marking is provided on at least one of the side faces; and
   wherein the semiconductor chip is disposed on the chip pad and a first main face of the chip pad remote from the semiconductor chip is at least partially exposed.

2. The semiconductor chip package according to claim 1, wherein
   the marking comprises an information about the semiconductor chip.

3. The semiconductor chip package according to claim 2, wherein
   the information about the semiconductor chip comprises a label or a code, wherein the label or the code characterizes the type or kind of the semiconductor chip.

4. The semiconductor chip package according to claim 2, wherein
   the information comprises one or more of the following group of information elements:
   type or kind of the semiconductor chip, current class, voltage class, power class, polarity, blocking capability, fabrication date.

5. The semiconductor chip package according to claim 1, wherein
   the marking comprises an information about the semiconductor chip package or the encapsulation body.

6. The semiconductor chip package according to claim 5, wherein
   the information comprises a label or a code, wherein the label or the code characterizes the type or the kind of the semiconductor chip package or the encapsulation body.

7. The semiconductor chip package according to claim 1, wherein
   the marking comprises at least alphanumeric character or a combination of alphanumeric characters.

8. The semiconductor chip package according to claim 1, wherein
the marking comprises a portion comprising the company logo or company mark of the manufacturer of the semiconductor chip package.

9. The semiconductor chip package according to claim 1, further comprising:
a first pair of first opposing side faces of a first surface area; and
a second pair of second opposing side faces of a second surface area, wherein
the first surface area is greater than the second surface area and the marking is provided on one of the first opposing side faces.

10. The semiconductor chip package according to claim 1, further comprising
four side faces; and
electrical contact elements connected with the semiconductor chip and extending outwardly, wherein
the electrical contact elements extend through two opposing side faces and the marking is provided on one of the other two opposing side faces.

11. The semiconductor chip package according to claim 10, wherein
the electrical contact elements extend exclusively through two opposing side faces which have the smallest surface areas from all side faces.

12. The semiconductor chip package according to claim 1, wherein
the first main face of the chip pad is exposed at one of the two opposing main faces of the encapsulation body.

13. The semiconductor chip package according to claim 1, wherein
the semiconductor chip package is configured as a surface-mount device.

14. The semiconductor chip package according to claim 13, wherein
the semiconductor chip package is one of the type TO252 or TO263.

15. An electronic device package, comprising:
an electronic device;
an encapsulation body encapsulating the electronic device;
a leadframe, the leadframe comprising electrical contact elements and a chip pad;
wherein the encapsulation body comprises two opposing main faces and side faces which connect the two main faces with each other, wherein the side faces have a smaller surface area than the main faces, respectively;
wherein a marking is provided on at least one of the side faces; and
wherein the electronic device is disposed on the chip pad and a first main face of the chip pad remote from the electronic device is at least partially exposed.

16. The electronic device package according to claim 15, wherein
the electronic device comprises a semiconductor chip, the semiconductor chip comprising one or more of a transistor, a metal-oxide semiconductor transistor, a vertical transistor, an insulated gate bipolar transistor, and a power transistor.

* * * * *